United States Patent [19]

Kimura

[11] Patent Number: 5,475,328
[45] Date of Patent: Dec. 12, 1995

[54] LOGARITHMIC INTERMEDIATE FREQUENCY AMPLIFIER CIRCUIT OPERABLE ON LOW VOLTAGE

[75] Inventor: Katsuji Kimura, Tokyo, Japan

[73] Assignee: NEC Corporation, Tokyo, Japan

[21] Appl. No.: 336,217

[22] Filed: Nov. 3, 1994

[30] Foreign Application Priority Data

Nov. 12, 1993 [JP] Japan .................................... 5-282952

[51] Int. Cl.$^6$ ............................ G06F 7/556; G06G 7/20
[52] U.S. Cl. ............................................ 327/351; 327/352
[58] Field of Search ..................................... 327/350, 351,
327/352, 354, 58, 62; 330/252, 254; 363/127

[56] References Cited

U.S. PATENT DOCUMENTS

| | | | |
|---|---|---|---|
| 4,052,679 | 10/1977 | Hosoya .................................... | 330/252 |
| 4,187,537 | 2/1980 | Avicola et al. .......................... | 363/127 |
| 4,663,594 | 5/1987 | Perkins .................................... | 327/231 |
| 4,680,553 | 7/1987 | Kimura et al. .......................... | 330/252 |
| 4,794,342 | 12/1988 | Kimura .................................... | 330/252 |
| 4,937,516 | 6/1990 | Sempel .................................... | 330/252 |
| 5,057,717 | 10/1991 | Kimura .................................... | 327/351 |
| 5,329,189 | 7/1994 | Ushida et al. ........................... | 330/254 |
| 5,345,185 | 9/1994 | Gilbert .................................... | 327/350 |

Primary Examiner—Toan Tran
Attorney, Agent, or Firm—Young & Thompson

[57] ABSTRACT

In a logarithmic intermediate frequency amplifier circuit including first through M-th intermediate frequency amplifiers which are connected in cascade and first through M-th double balanced differential circuits which are connected to the first through the M-th intermediate frequency amplifiers, respectively, each of the first through the M-th double balanced differential circuits comprises primary, secondary, and tertiary differential circuits. The primary differential circuit includes a pair of transistors each of which is one of NPN and PNP types and which are connected to a first constant current source. The secondary differential circuit includes a pair of transistors each of which is another one of NPN and PNP types and which are connected to a second constant current source. The tertiary differential circuit includes a pair of transistors each of which is the other one of the NPN and the PNP types and which are connected to a third constant current source. The primary differential circuit is connected to the second and the third constant current sources and delivers a differential output to the secondary and the tertiary differential circuits so as to reduce currents of the second and the third constant current sources.

4 Claims, 9 Drawing Sheets

LOGARITHMIC INTERMEDIATE FREQUENCY AMPLIFIER CIRCUIT OPERABLE ON LOW VOLTAGE

SUMMARY OF THE INVENTION

This invention relates to a logarithmic intermediate frequency amplifier circuit and, in particular, to a logarithmic intermediate frequency amplifier circuit implemented by a bipolar semiconductor integrated circuit.

Such a logarithmic intermediate frequency amplifier circuit is disclosed in U.S. Pat. No. 4,680,553. The logarithmic intermediate frequency amplifier circuit comprises a plurality of intermediate frequency amplifiers which are connected in cascade, a plurality of double balanced differential circuits each of which is connected to each of the plurality of intermediate frequency amplifiers, and an adding circuit connected to the plurality of double balanced differential circuits for adding outputs of the plurality of double balanced differential circuits. Each of the plurality of intermediate frequency amplifiers comprises an intermediate differential circuit which is supplied with an intermediate differential input and which produces an intermediate differential output. Each of the plurality of double balanced differential circuits serves as a full-wave rectifier.

Each of the plurality of double balanced differential circuits comprises primary, secondary, and tertiary differential circuits. The primary differential circuit is connected to the secondary and the tertiary differential circuits. The secondary and the tertiary differential circuits are cross coupled to each other. The primary differential circuit is supplied with the intermediate differential input and comprises a plurality of differential pairs of transistors which are connected, in parallel, to one another. The secondary differential circuit is supplied with the intermediate differential output and comprises a differential pair of transistors. Similarly, the tertiary differential circuit is supplied with the intermediate differential output and comprises a differential pair of transistors. Each of the transistors in the primary, the secondary, and the tertiary differential circuits is the same type defined by an NPN type or a PNP type.

In the above-mentioned logarithmic intermediate amplifier circuit, each of the double balanced differential circuits generally has stacked transistor structure wherein two transistors of the same type are stacked. For example, one of the transistors of the tertiary differential circuit is stacked on one of the transistors of the primary differential circuit. Furthermore, an emitter resistor circuit is connected to at least one of the plurality of differential pairs of transistors in the primary differential circuit in order to give a predetermined logarithmic characteristic to the double balanced differential circuit. In this case, it causes a disadvantage that the logarithmic intermediate frequency amplifier circuit can not operate on low voltage, in particular, below 2 volts.

SUMMARY OF THE INVENTION

It is therefore an object of this invention to provide a logarithmic intermediate frequency amplifier circuit which is operable on low voltage.

Other object of this invention will become clear as the description proceeds.

On describing the gist of this invention, it is possible to understand that a logarithmic intermediate frequency amplifier circuit comprises first through M-th intermediate frequency amplifiers which are connected in cascade, where M represents a positive integer greater than unity, first through M-th double balanced differential circuits each of which is connected to each of the first through the M-th intermediate frequency amplifiers, and an adding circuit connected to the first through the M-th double balanced differential circuits for adding outputs of the first through the M-th double balanced differential circuits. Each of the first through the M-th intermediate frequency amplifiers comprises an intermediate differential circuit which is supplied with an intermediate differential input and which produces an intermediate differential output.

According to an aspect of this invention, each of the first through the M-th double balanced differential circuits comprises a primary differential circuit comprising a primary differential pair of transistors each of which is one of NPN and PNP types and which are connected to first and second input terminals and a first constant current source supplying a first current. The primary differential circuit receives a first differential input through the first and the second input terminals and producing a first differential output. Each of the first through the M-th double balanced differential circuits further comprises a secondary differential circuit comprising a secondary differential pair of transistors each of which is another one of the NPN and the PNP types different from the first type and which are connected to third and fourth input terminals and a second constant current source supplying a second current, and a tertiary differential circuit comprising a tertiary differential pair of transistors each of which is other one of the NPN and the PNP types and which are connected to the third and the fourth input terminals and a third constant current source supplying a third current. Each of the primary differential pair of transistors is connected to each of the second and the third constant current sources and delivers the first differential output to the secondary and the tertiary differential circuits so as to reduce the second and the third currents. The secondary and the tertiary differential circuits cooperatively produce a second differential output through first and second output terminals as one of the outputs of the first through the M-th double balanced differential circuits.

DESCRIPTION OF THE PREFERRED EMBODIMENT

Figure 1:
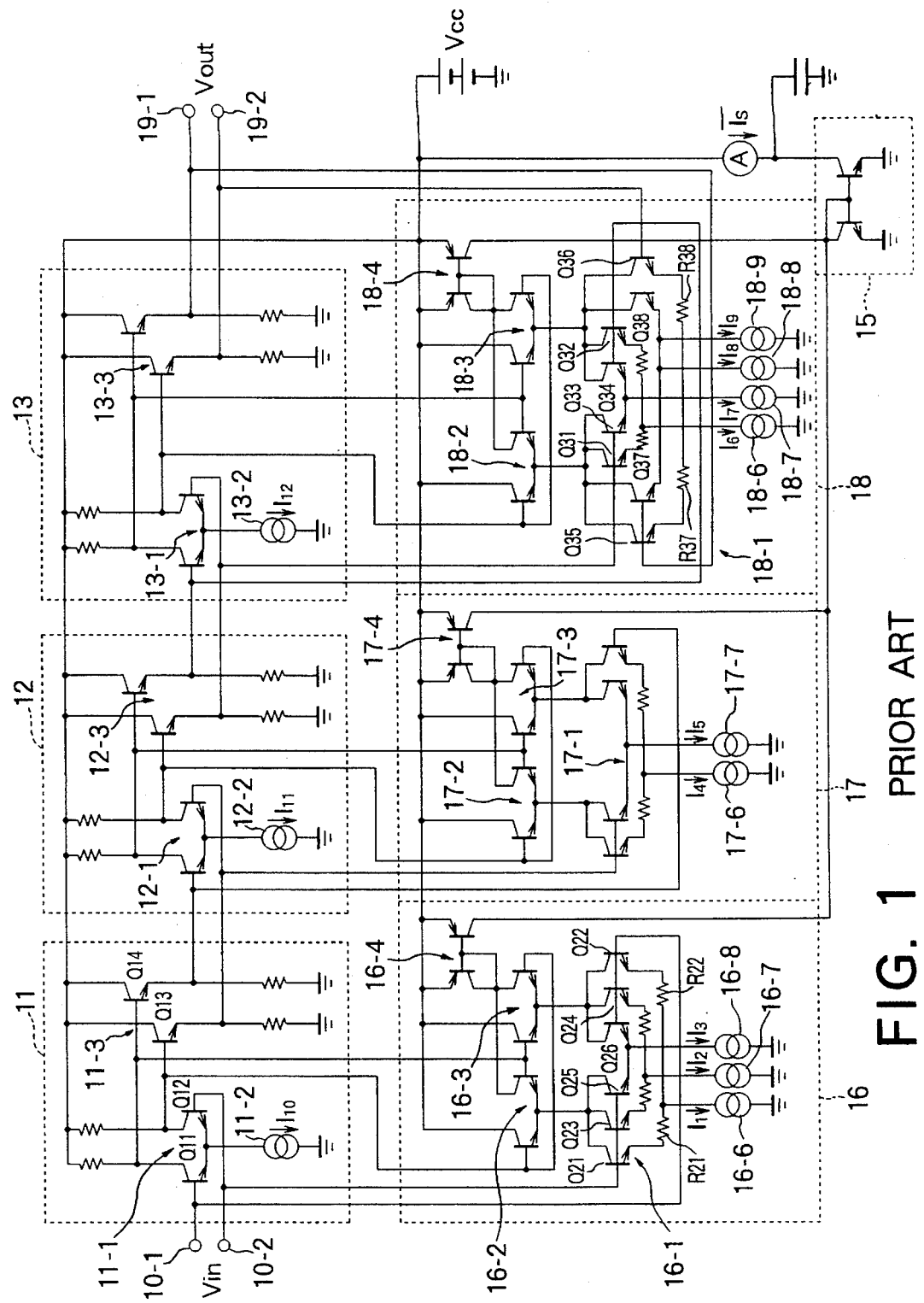
FIG. 1 shows a circuit arrangement of a conventional logarithmic intermediate frequency amplifier circuit.

Referring to FIG. 1, a conventional logarithmic intermediate frequency amplifier circuit will be described at first in order to facilitate an understanding of the present invention. The amplifier circuit is disclosed in United States Patent cited hereinabove. In FIG. 1, the amplifier circuit comprises first through third intermediate frequency amplifiers 11 to 13 which are connected in cascade and first through third double balanced differential circuits 16 to 18 which are connected to the first through the third intermediate frequency amplifiers 11 to 13, respectively. An intermediate frequency signal having a voltage Vin is supplied through first through second circuit input terminals 10-1 and 10-2 to the first intermediate frequency amplifier 11 as a circuit input signal and to the first double balanced differential circuit 16. Each of the first through the third double balanced differential circuits 16 to 18 serves as a full wave rectifier. Such a logarithmic intermediate frequency amplifier circuit is implemented by a bipolar semiconductor integrated circuit.

The first intermediate frequency amplifier 11 comprises an intermediate differential circuit 11-1 comprising transistors Q11 and Q12, a constant current source 11-2 connected to the intermediate differential circuit 11-1, and an emitter follower circuit 11-3 comprising emitter follower transistors Q13 and Q14. The intermediate differential circuit 11-1 is supplied with the intermediate frequency signal as an intermediate differential input and delivers an intermediate differential output to the first double balanced differential circuit 16 and the second intermediate frequency amplifier 12 through the emitter follower circuit 11-3. The emitter follower circuit 11-3 serves as a level shift circuit.

The second and the third intermediate frequency amplifiers 12 and 13 have the same construction as the first intermediate frequency amplifier 11. Namely, the second intermediate frequency amplifier 12 comprises an intermediate differential circuit 12-1, a constant current source 12-2, and an emitter follower circuit 12-3 while the third intermediate frequency amplifier 13 comprises an intermediate differential circuit 13-1, a constant current source 13-2, and an emitter follower circuit 13-3. An intermediate differential output of the intermediate differential circuit 13-1 is delivered as an amplified output signal to first and second circuit output terminals 19-1 and 19-2 through the emitter follower circuit 13-3.

The first double balanced differential circuit 16 comprises primary, secondary, and tertiary differential circuits 16-1 to 16-3, a current mirror circuit 16-4, and first through third constant current sources 16-6 to 16-8 which are for supplying first through third currents I1 to I3, respectively. The primary differential circuit 16-1 comprises first through third differential pairs of transistors. The first differential pair of transistors consists of transistors Q21 and Q22. Emitter electrodes of the transistors Q21 and Q22 are connected to each other and are connected to the first constant current source 16-6. Thus, the first differential pair of transistors is driven by the first constant current source 16-6. Similarly, the second differential pair of transistors consists of transistors Q23 and Q24 and is driven by the second constant current source 16-7. The third differential pair of transistors consists of transistors Q25 and Q26 and is driven by the third constant current source 16-8.

The second and the third double balanced differential circuits 17 and 18 are similar to the first double balanced differential circuit 16 except for primary differential circuits 17-1 and 18-1, respectively. Namely, the second double balanced differential circuit 17 comprises the primary, secondary, and tertiary differential circuits 17-1 to 17-3, a current mirror circuit 17-4, and first and second constant current sources 17-6 and 17-7 which are for supplying third and fourth currents I4 and I5, respectively. The primary differential circuit 17-1 comprises first and second differential pairs of transistors which are driven by the first and the second constant current sources 17-6 and 17-7, respectively. Similarly, the third double balanced differential circuit 18 comprises the primary, secondary, and tertiary differential circuits 18-1 to 18-3, a current mirror circuit 18-4, and first through fourth constant current sources 18-6 to 18-9. The primary differential circuit 18-1 comprises first and second differential pairs of transistors which consist of the transistors Q31 and Q32, Q33 and Q34. The first and the second differential pairs of transistors are supplied with the intermediate differential input from the third intermediate frequency amplifier 13 and are driven by the first and the second constant current sources 18-6 and 18-7, respectively. The primary differential circuit 18-1 further comprises third and fourth differential pairs of transistors which consists of the transistors Q35 and Q36, Q37 and Q38. The third and the fourth differential pairs of transistors are supplied with the amplified output signal from the emitter follower circuit 13-3 and are driven by the third and the fourth constant current sources 18-8 and 18-9, respectively.

In the first double balanced differential circuit 16, the primary differential circuit 16-1 receives the intermediate differential input from the first intermediate frequency amplifier 11 and produces a primary differential output. The secondary and the tertiary differential circuits 16-2 and 16-3 receive the intermediate differential output from the first intermediate frequency amplifier 11 through the emitter follower circuit 11-3 and are driven by the primary differential output. Outputs of the secondary and the tertiary differential circuits 16-2 and 16-3 are supplied to the current mirror circuit 16-4. An output of the first double balanced differential circuit 16 is a full wave rectified signal of the intermediate differential output of the first intermediate frequency amplifier 11.

Such an operation is applied to the second and the third double balanced differential circuits 17 and 18. Thus, outputs of the current mirror circuits 16-4, 17-4, and 18-4 are supplied to a current adding circuit 15. Since the outputs of the current mirror circuits 16-4, 17-4, and 18-4 are equal in phase to one another, the outputs are added linearly by the current adding circuit 15. As a result, the logarithmic intermediate frequency amplifier circuit is equipped with nine full wave rectifiers with respect to three intermediate frequency amplifiers. Accordingly, it is possible to enlarge a dynamic range of the intermediate frequency signal.

By the way, it should be noted here that all of the transistors in the primary, the secondary, and the tertiary differential circuits 16-1 to 16-3 of the first double balanced differential circuit 16 have the same type, namely, the NPN type. Furthermore, the first double balanced differential circuit 16 has stacked transistor structure wherein two transistors of the same type are stacked. For example, one of the transistors of the secondary differential circuit 16-2 is stacked on the transistor Q21 of the primary differential circuit 16-1. In addition to the stacked transistor structure, an emitter resistor circuit comprising resistors R21 and R22 is connected between the emitter electrodes of the first differential pair of transistors Q21 and Q22 in order to obtain a predetermined logarithmic characteristic which is different from those of the second and the third double balanced differential circuits 17 and 18. These points apply to the second and the third double balanced differential circuits 17 and 18. In this case, it causes a disadvantage that the logarithmic intermediate frequency amplifier circuit can not operate on low voltage, in particular, below 2 volts.

Figure 2:
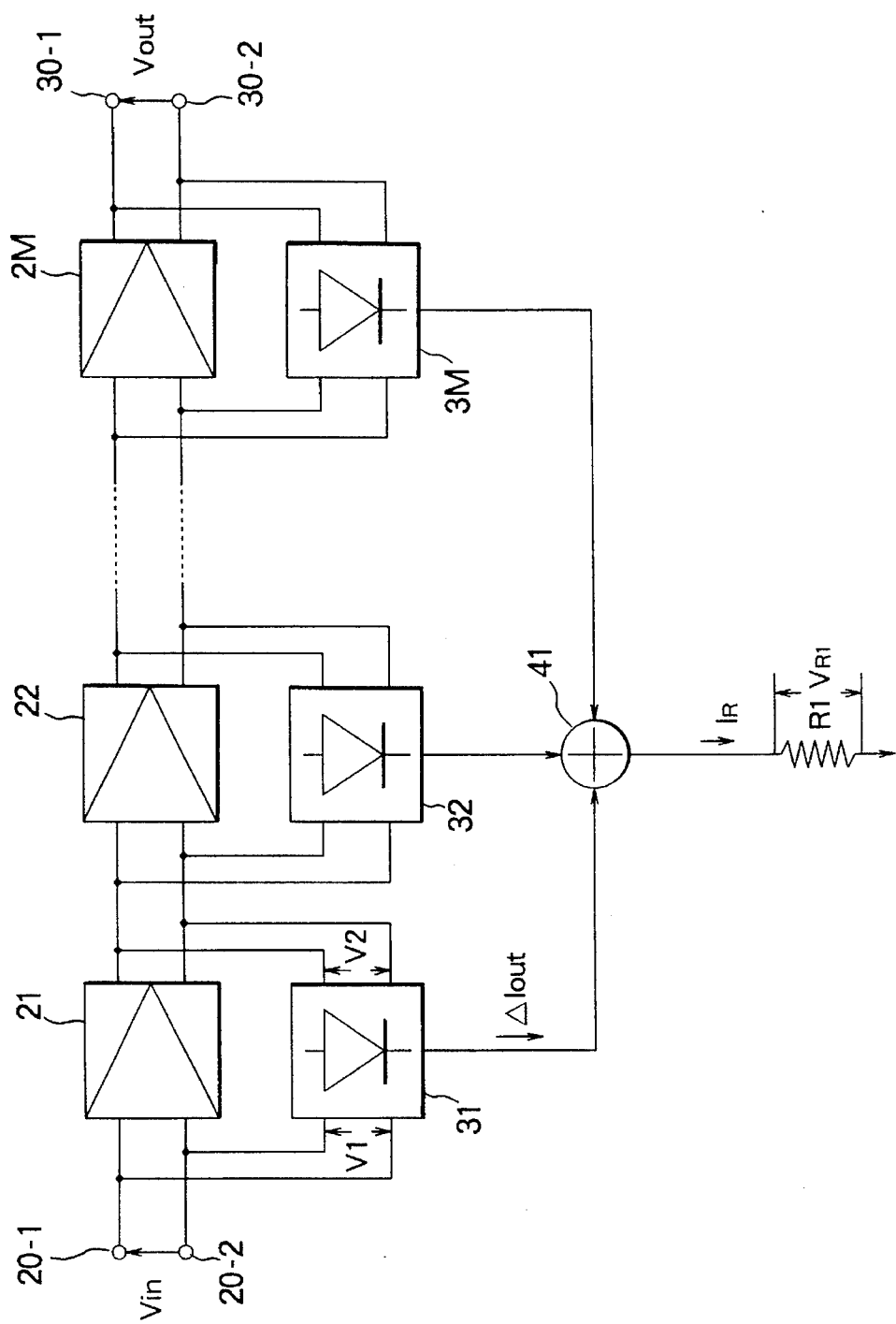
FIG. 2 shows a logarithmic intermediate frequency amplifier circuit according to a first embodiment of this invention.
Figure 3:
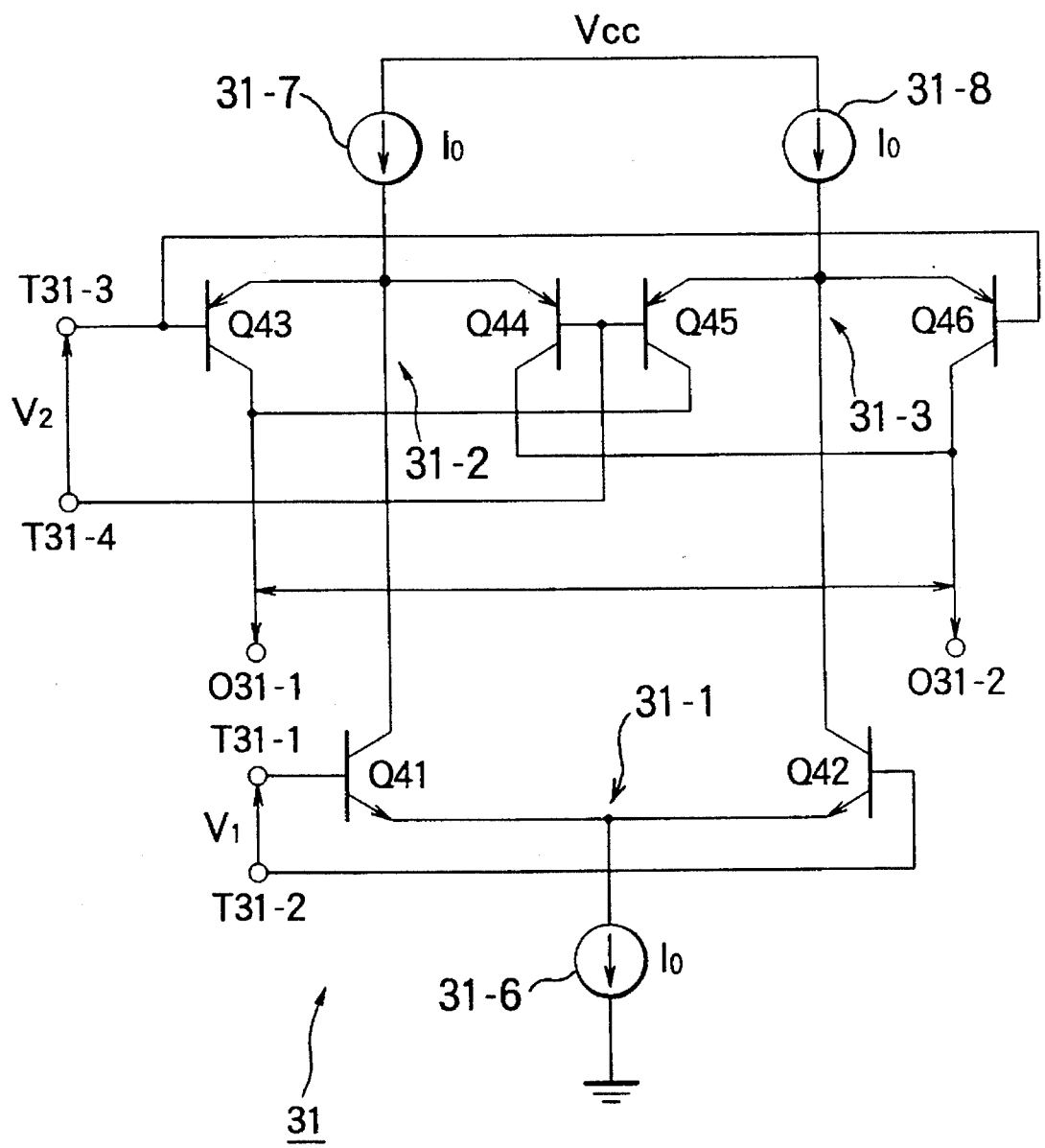
FIG. 3 shows a circuit arrangement of a double balanced differential circuit illustrated in FIG. 2.
Figure 4:
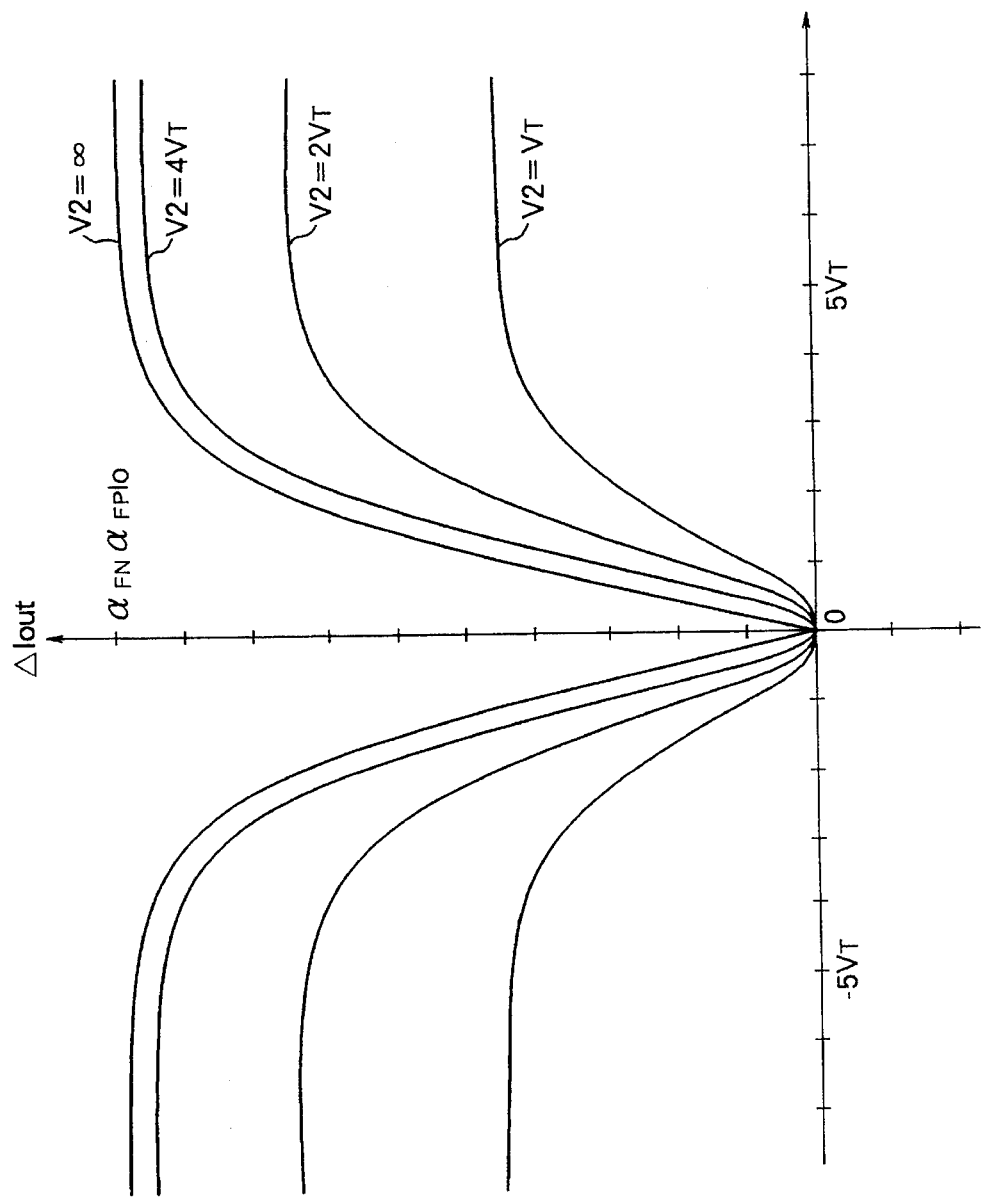
FIG. 4 shows a characteristic of the double balanced differential circuit illustrated in FIG. 3.

Referring to FIGS. 2 to 4, the description will be made as regards a logarithmic intermediate frequency amplifier circuit according to a first embodiment of this invention. The amplifier circuit receives an intermediate frequency signal having a voltage Vin through first and second circuit input terminals 20-1 and 20-2 and delivers an amplified output signal having a voltage Vout through first and second circuit output terminals 30-1 and 30-2. The amplifier circuit comprises first through M-th intermediate frequency amplifiers 21 to 2M which are connected in cascade, where M represents a positive integer greater than unity, first through M-th double balanced differential circuits 31 to 3M each of which is connected, in parallel, to each of the first through the M-th intermediate frequency amplifiers 21 to 2M. The amplifier circuit further comprises an adding circuit 41 connected to the first through the M-th double balanced differential circuits 31 to 3M. As described in conjunction with FIG. 1, each of the first through the M-th intermediate frequency amplifiers 21 to 2M comprises an intermediate differential circuit and an emitter follower circuit. The intermediate differential circuit is supplied with an intermediate differential input and produces an intermediate differential output. The amplifier circuit is implemented by a bipolar semiconductor integrated circuit.

In FIG. 3, the first double balanced differential circuit 31 comprises primary, secondary, and tertiary differential circuits 31-1 to 31-3, first through third constant current sources 31-6 to 31-8. The first constant current source 31-6 is grounded while the second and the third constant current sources 31-7 and 31-8 are connected to a power source of a voltage Vcc. The first through the third constant current sources 31-6 to 31-8 are for supplying first through third currents. In the example, the first through the third currents are equal to one another and are therefore depicted at I0. The primary differential circuit 31-1 comprises a primary differential pair of transistors Q41 and Q47 each of which is an NPN type. The transistor Q41 has a base electrode connected to a first input terminal T31-1, an emitter electrode connected to the first constant current source 31-6, and a collector electrode connected to the second constant current source 31-7. The transistor Q42 has a base electrode connected to a second input terminal T31-2, an emitter electrode connected to the first constant current source 31-6, and a collector electrode connected to the third current source 31-8. Such a primary differential pair of transistor Q41 and Q42 may be called an emitter coupled pair. The primary differential circuit 31-1 receives a first differential input of a voltage V1 through the first and the second input terminals T31-1 and T31-2. In the example, the first and the second input terminals T31-1 and T31-2 are connected to the first and the second circuit input terminals 20-1 and 20-2 (FIG. 2), respectively, and are therefore supplied with the intermediate frequency signal as the first differential input. The primary differential circuit 31-1 delivers a first differential output through collector electrodes of the transistors Q41 and Q42.

The secondary differential circuit 31-2 comprises a secondary differential pair of transistors Q43 and Q44 each of which is a PNP type different from those of the transistors Q41 and Q42. The transistor Q43 has a base electrode connected to a third input terminal T31-3, an emitter electrode connected to the second constant current source 31-7, and a collector electrode connected to a first output terminal O31-1. The transistor Q44 has a base electrode connected to a fourth input terminal T31-4, an emitter electrode connected to the second current source 31-7, and a collector electrode connected to a second output terminal O31-2. The secondary differential circuit 31-2 receives a second differential input of a voltage V2 through the third and the fourth input terminals T31-3 and T31-4. In the example, the third and the fourth input terminals T31-3 and T31-4 are connected to an output side of the first intermediate frequency amplifier 21 (FIG. 2) and are therefore applied with the intermediate differential output, as the second differential input, through the emitter follower circuit of the first intermediate frequency amplifier 21 (FIG. 2).

The tertiary differential circuit 31-3 comprises a tertiary differential pair of transistors Q45 and Q46 which are the PNP type. The transistor Q45 has a base electrode connected to the fourth input terminal T31-4, an emitter electrode connected to the third current source 31-8, and a collector electrode connected to the first output terminal O31-1. The transistor Q46 has a base electrode connected to the third input terminal T31-3, an emitter electrode connected to the third current source 31-8, and a collector electrode connected to the second output terminal T31-2. Like the secondary differential circuit 31-2, the tertiary differential circuit 31-3 receives the second differential input, namely, the intermediate differential output of the first intermediate frequency amplifier 21 through the third and the fourth input terminals T31-3 and T31-4. The secondary and the tertiary differential circuits 31-2 and 31-3 cooperatively deliver a second differential output through the first and the second output terminals O31-1 and O31-2. The secondary and the tertiary differential circuits 31-2 and 31-3 are connected in a cross connection form and therefore may collectively be called a cross connection emitter coupled pair.

As apparent from FIG. 3, the transistors Q41 and Q42 are the NPN type which is different from those of the transistors Q43 to Q46. This means that each of the first through the M-th double balanced differential circuits 31 to 3M is equivalent to a complementary circuit. In such a double balanced differential circuit, the transistors Q41 and Q42 serve so as to reduce the second and the third currents of the second and the third constant current sources 31-7 and 31-8, respectively.

In the example, it is assumed that the second differential output of each of the first through the M-th double balanced differential circuits 31 to 3M is defined by a differential output current $\Delta I_{out}$. The differential output current $\Delta I_{out}$ is represented by a first equation given by:

$$\Delta I_{out} = \alpha_{FN} \alpha_{FP} I_0 \tan h(V1/2V_T) \cdot \tan h(V2/2V_T),$$

where $\alpha_{FN}$ and $\alpha_{FP}$ represent d.c. common-base current gain factors of the NPN transistor and the PNP transistor, respectively, and Vt represents the thermal voltage represented by:

$$V_t = kT_q.$$

In this equation, k, T, and q represent Boltzmann's constant, absolute temperature, and the electric charge of a unit electron, respectively.

It is possible to realize the phase synchronization between the voltage V1 of the first differential input and the voltage V2 of the second differential input. Under the circumstances, when the voltage V2 has the same phase as the voltage V1, the differential output current $\Delta I_{out}$ is a full wave rectified signal as obvious from the first equation defined above. When the voltage V2 is regarded as a parameter, characteristic of the differential output current $\Delta I_{out}$ is shown in FIG. 4.

Figure 5:
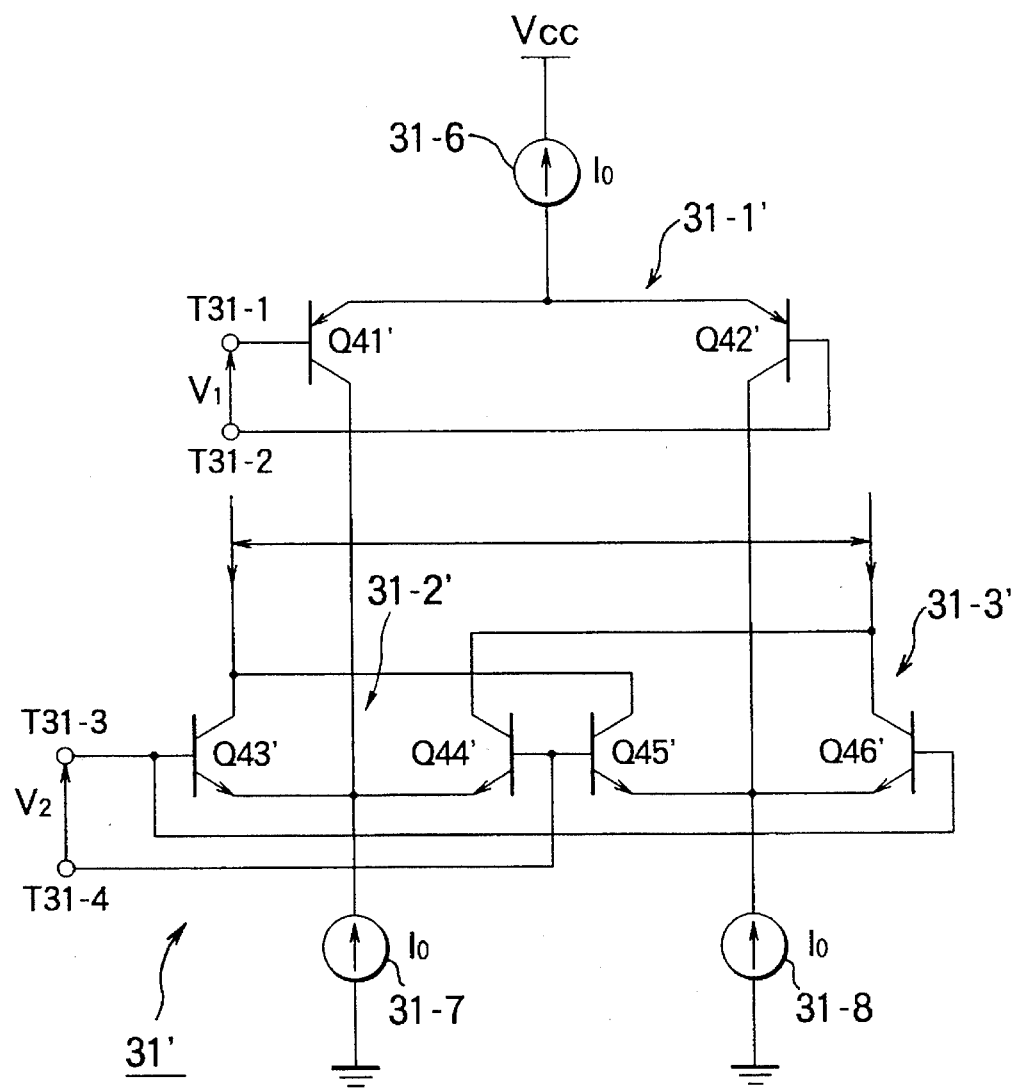
FIG. 5 shows a circuit arrangement of a modification of the double balanced differential circuit illustrated in FIG. 3.

Referring to FIG. 5, a double balanced differential circuit 31' is similar to that illustrated in FIG. 3 except that a primary differential circuit 31-1' comprises transistors Q41' and Q42' of the PNP type and that secondary and tertiary differential circuit 31-2' and 31-3' comprise transistors Q43' and Q44', Q45' and Q46' of the NPN type. The first constant current source 31-6 is connected to the power source of the voltage Vcc. The second and the third constant current sources 31-7 and 31-8 are grounded. In such a double balanced differential circuit 31', the first equation defined before is approved. As a result, it is possible to obtain the characteristic shown in FIG. 4.

Turning to FIG. 2, all of the differential output currents delivered from the first through the M-th double balanced differential circuits 31 to 3M are added into an added output current $I_R$ by the adding circuit 41. As the intermediate frequency signal becomes larger, the first through the M-th double balanced differential circuits 31 to 3M are saturated in the order from the last stage because each of the first through the M-th double balanced differential circuits 31 to 3M has a limiting characteristic. As a result, it is possible to obtain the added output current $I_R$ having a logarithmic characteristic which is approximated to a polygonal line. The added output current $I_R$ is converted into an output voltage $V_{R1}$ by an output resistor R1. In such a logarithmic intermediate frequency amplifier circuit comprising the double balanced differential circuits illustrated in FIGS. 3 and 5, it is possible to operate on low voltage, for example, below 1 volt, even if each of the first through the M-th double balanced differential circuits 31 to 3M has a stacked transistor structure of two transistors, for example, the transistors Q41 and Q43.

Figure 6:
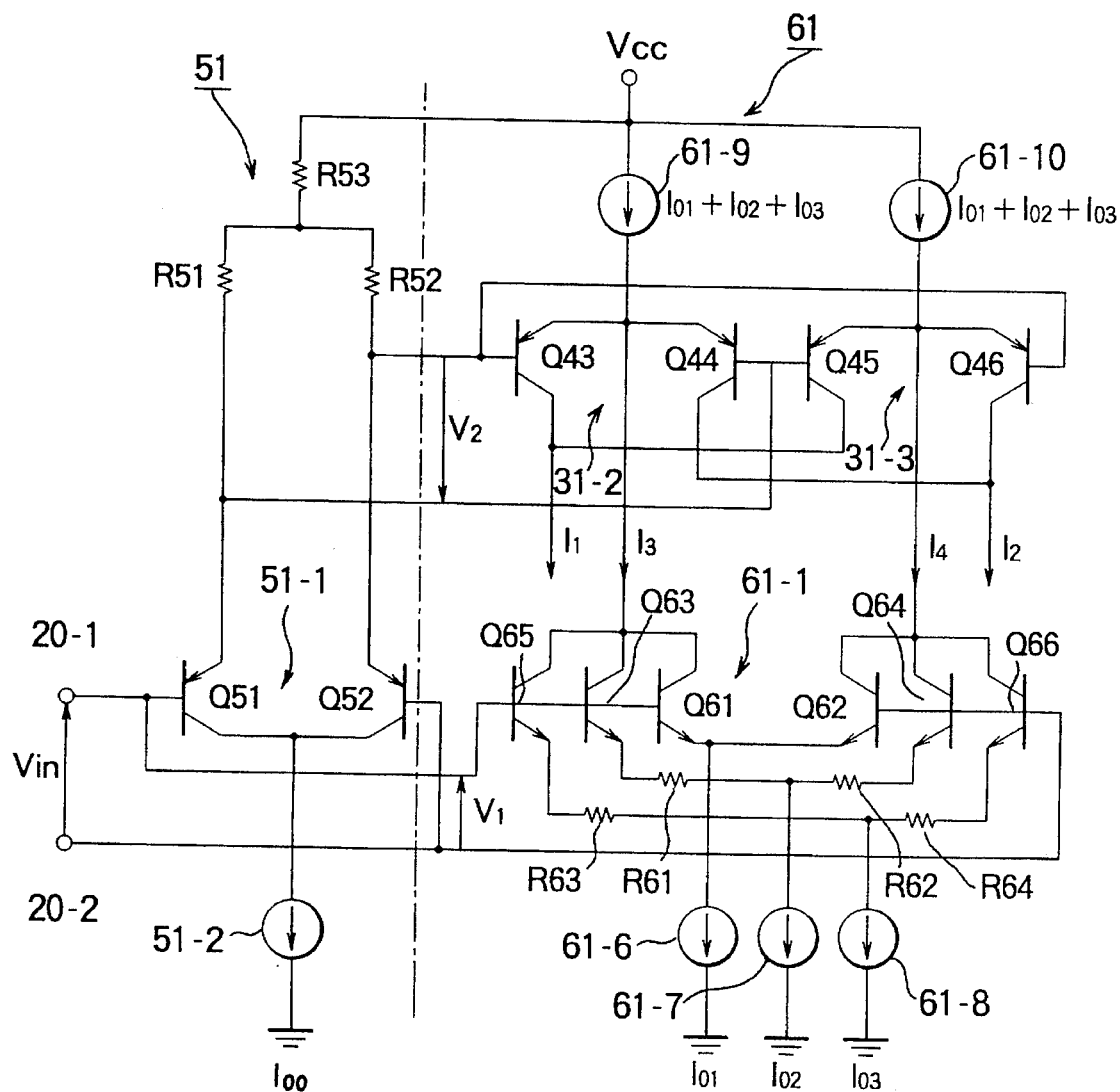
FIG. 6 shows a circuit arrangement of an intermediate amplifier and a double balanced differential circuit according to a second embodiment of this invention.
Figure 7:
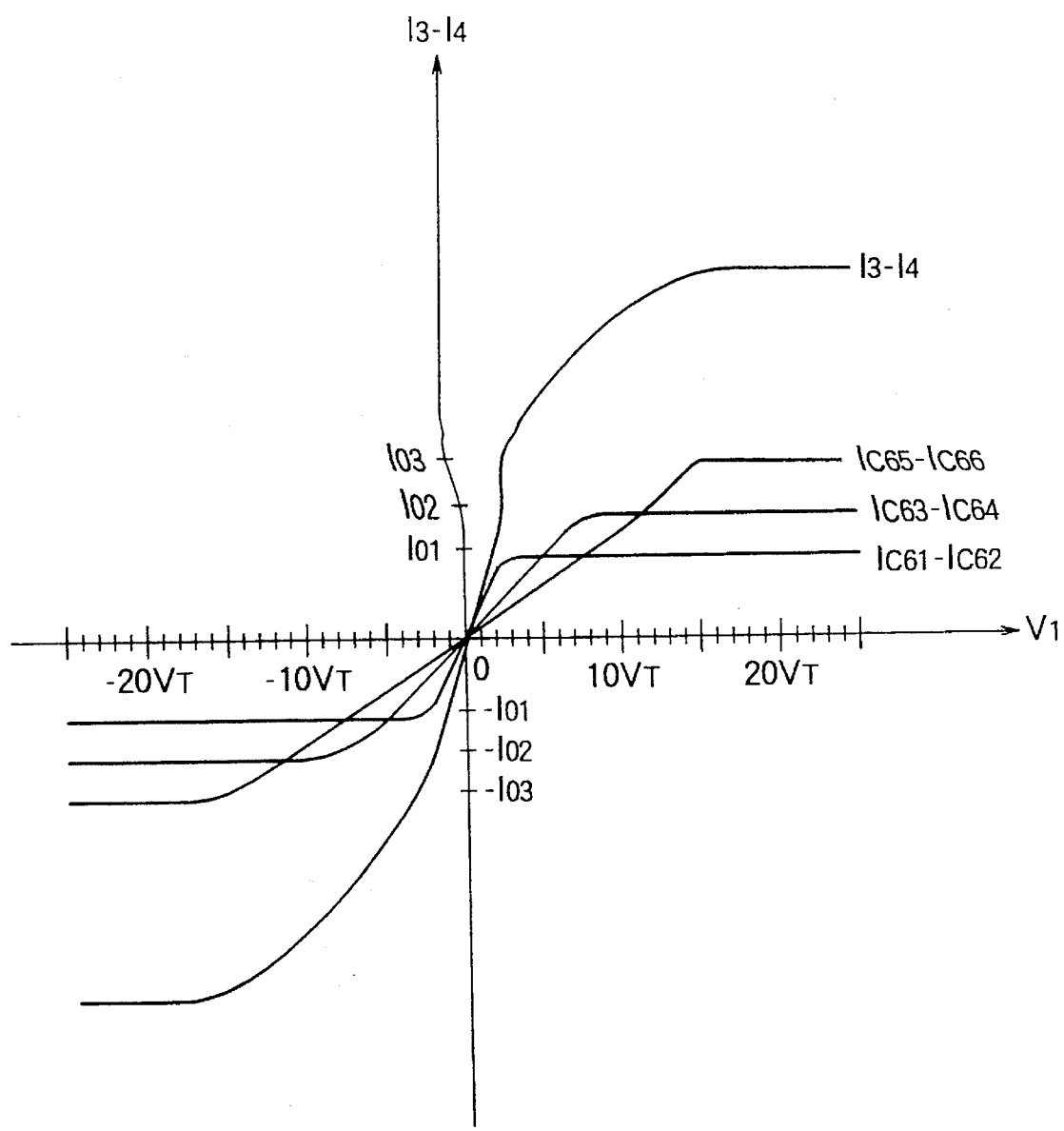
FIG. 7 shows a characteristic of the double balanced differential circuit illustrated in FIG. 6.

Referring to FIGS. 6 and 7, the description will proceed to a double balanced differential circuit 61 according to a second embodiment of this invention. The double balanced differential circuit 61 is connected to an intermediate frequency amplifier 51 comprising an intermediate differential circuit 51-1, a constant current source 51-2, and resistors R51 and R53. As mentioned in conjunction with FIG. 1, the intermediate differential circuit 51-1 is supplied with the intermediate frequency signal having the voltage Vin. The intermediate differential circuit 51-1 is similar to that illustrated in FIG. 1 except that the emitter follower circuit 11-3 is omitted and that the resistor R53 is added as a voltage drop resistor. The intermediate differential circuit 51-1 therefore directly delivers an intermediate differential output to the double balanced differential circuit 61 as the second differential input of the voltage V2. The intermediate frequency signal is supplied to the double balanced differential circuit 61 as the first differential input of the voltage V1 which is equal to the voltage Vin.

The double balanced differential circuit 61 comprises a primary differential circuit 61-1 and first through fifth constant current sources 61-6 to 61-10 in addition to the secondary and the tertiary differential circuits 31-2 and 31-3 which are illustrated in FIG. 3. The primary differential circuit 61-1 comprises first through third differential pairs of transistors which are connected, in parallel, to one another. The first differential pair comprises transistors Q61 and Q62. The second differential pair comprises transistors Q63 and Q64 while the third differential pair comprises transistors Q65 and Q66. It should be noted here that the type of the transistors Q61 to Q66 is the NPN type and is different from those of the transistors Q43 to Q46.

Base electrodes of the transistors Q61, Q63, and Q65 are connected in common to the first circuit input terminal 20-1 while base electrodes of the transistors Q62, Q64, and Q66 are connected in common to the second circuit input terminal 20-2. Emitter electrodes of the transistors Q61 and Q62 are connected to the first constant current source 61-6.

Emitter electrodes of the transistors Q63 and Q64 are connected to the second constant current source 61-7 through an emitter resistor circuit comprising emitter resistors R61 and R62. Similarly, emitter electrodes of the transistors Q65 and Q66 are connected to the third constant current source 61-8 through emitter resistors R63 and R64. Both the emitter resistors R61 and R62 have a first resistance value. Similarly, the emitter resistors R63 and R64 have a second resistance value which is different from the first resistance value. As a result, the first through the third differential pairs of the transistors have first through third transfer characteristic which are different from one another. The first through the third constant current sources 61-6 to 61-8 are for supplying first through third currents Io1 to Io3, respectively.

The fourth constant current source 61-9 is connected between the power source of the voltage Vcc and the emitter electrodes of the transistors Q43 and Q44. The fifth constant current source 61-10 is connected between the power source of the voltage Vcc and the emitter electrodes of the transistors Q45 and Q46. The fourth and the fifth constant current sources 61-9 and 61-10 are for supplying fourth and fifth currents, respectively. In the example, the fourth and the fifth currents are equal to each other and are given by (Io1+Io2+Io3). It will be assumed that the transistors Q43 and Q46 deliver first and second output currents I1 and I2 through the collector electrodes thereof and that the fourth and the fifth constant current sources 61-9 and 61-10 supply third and fourth output currents to the primary differential circuit 61-1.

In the double balanced differential circuit 61, it is possible to obtain a logarithmic characteristic as shown in FIG. 7. In other words, the double balanced differential circuit 61 can be regarded as a pseudo logarithmic full wave rectifier because the double balanced differential circuit 61 comprises the primary differential circuit 61-1 comprising the first through the third differential pairs of the transistors which are connected in parallel and which have the different transfer characteristics. The pseudo logarithmic full wave rectifier has an improved accuracy relative to the full wave rectifier illustrated in FIG. 3. Although the primary differential circuit 61-1 comprises the first through the third differential pairs of the transistors, the number of the differential pair can be arbitrarily determined.

Figure 8:
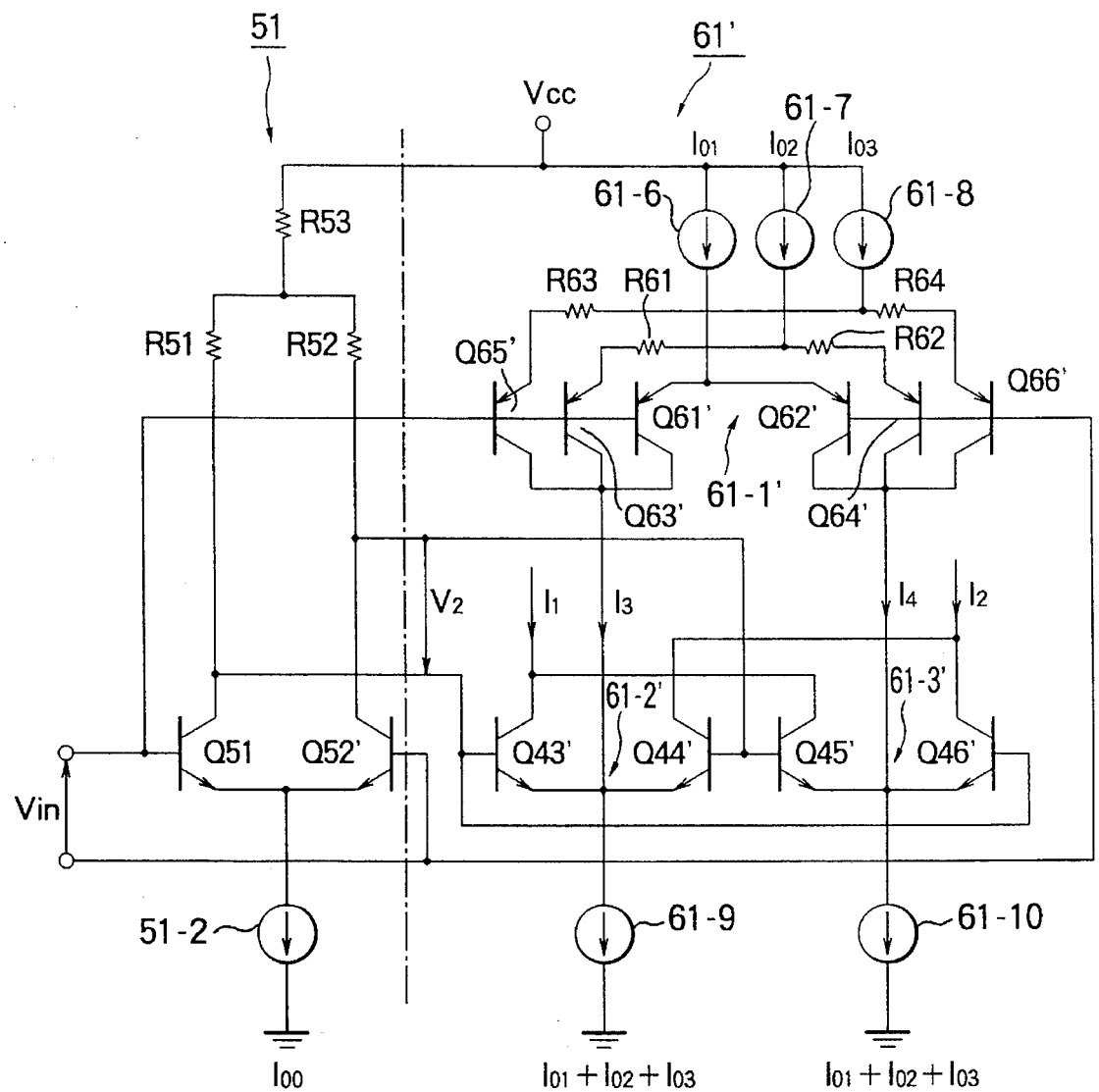
FIG. 8 shows a circuit arrangement of a modification of the intermediate amplifier and the double balanced differential circuit illustrated in FIG. 6.

Referring to FIG. 8, a double balanced differential circuit 61' is similar to that illustrated in FIG. 6 except that a primary differential circuit 61-1' comprises transistors Q61' to Q66' of the PNP type and that the secondary and the tertiary differential circuits 61-2' and 61-3' comprise transistors Q43' and Q44', Q45' and Q46' of the NPN type. The first through the third constant current sources 61-6 to 61-8 are connected to the power source of the voltage Vcc. The fourth and the fifth constant current sources 61-9 and 61-10 are grounded. In such a double balanced differential circuit 61', it is possible to obtain the characteristic shown in FIG. 7. Namely, the double balanced differential circuit 61' serves as the pseudo logarithmic full wave rectifier.

Figure 9:
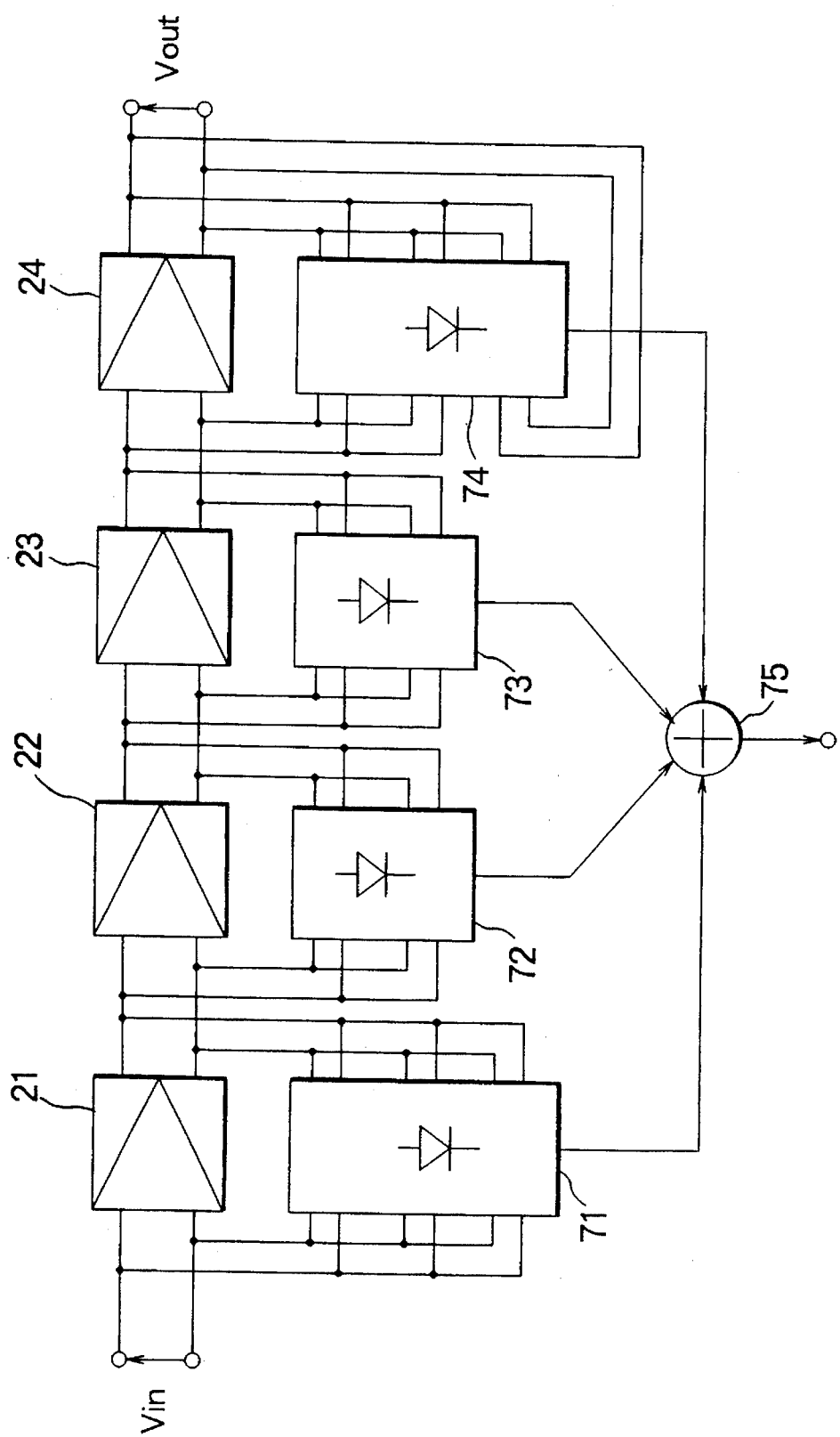
FIG. 9 shows a logarithmic intermediate frequency amplifier circuit according to a second embodiment of this invention.

Referring to FIG. 9, a logarithmic intermediate frequency amplifier circuit comprises the first through the fourth intermediate frequency amplifiers 21 to 24, first through fourth double balanced differential circuits 71 to 74, and an adding circuit 75. Each of the first through the fourth double balanced differential circuits 71 to 74 can be realized by the double balanced differential circuit illustrated in FIG. 6 or 8. In such a logarithmic intermediate frequency amplifier circuit, it is possible to operate on low voltage, for example, below 1 volt, even if the first through the fourth double balanced differential circuits 71 to 74 has a stacked transistor structure of two transistors, for example, the transistors Q43 and Q61.

While this invention has thus far been described in conjunction with a few embodiments thereof, it will readily be possible for those skilled in the art to put this invention into practice in various other manners. For example, although the primary differential circuit of the double balanced differential circuit is supplied with the intermediate differential input of the intermediate frequency amplifier, the primary differential circuit may be supplied with the intermediate differential output on condition that the intermediate differential output has the same phase as the intermediate differential input.

What is claimed is:

1. A logarithmic intermediate frequency amplifier circuit comprising first through M-th intermediate frequency amplifiers which are connected in cascade, where M represents a positive integer greater than unity, the first one of the cascaded amplifiers receiving an input signal and the last one of the cascaded amplifiers providing an amplified output signal, first through M-th double balanced differential circuits each of which is connected to each of said first through said M-th intermediate frequency amplifiers, and an adding circuit connected to said first through said M-th double balanced differential circuits for adding outputs of said first through said M-th double balanced differential circuits and for providing a logarithmic output signal, each of said first through M-th intermediate frequency amplifiers comprising an intermediate differential circuit which is supplied with an intermediate differential input and which produces an intermediate differential output, each of said first through said M-th double balanced differential circuits comprising:

a primary differential circuit comprising a primary differential pair of transistors, both of said transistors of said primary differential pair of transistors being one of NPN and PNP types and which are connected to first and second input terminals and a first constant current source supplying a first current, said primary differential circuit receiving a first differential input from said intermediate differential input of a corresponding intermediate frequency amplifier through said first and said second input terminals and producing a first differential output;

a secondary differential circuit comprising a secondary differential pair of transistors, both of transistors of said secondary differential pair of transistors being the other one of said NPN and said PNP types and which are connected to third and fourth input terminals receiving said intermediate differential output from said corresponding intermediate frequency amplifier and a second constant current source supplying a second current; and a tertiary differential circuit comprising a tertiary differential pair of transistors, both of said transistors of said tertiary differential pair of transistors being the other one of said NPN and said PNP types and which are connected to said third and said fourth input terminals receiving said intermediate differential output from said corresponding intermediate frequency amplifier and a third constant current source supplying a third current;

said first differential output of said primary differential pair of transistors being connected to each of said second and said third constant current sources and delivering said first differential output to said secondary and said tertiary differential circuits so as to reduce said second and said third currents, said secondary and said tertiary differential circuits cooperatively producing a second differential output through first and second output terminals as one of said outputs of said first through said M-th double balanced differential circuits.

2. A logarithmic intermediate frequency amplifier circuit as claimed in claim 1, wherein said first and said second input terminals are supplied with said intermediate differential input as said first differential input, said third and said fourth input terminals being supplied with said intermediate differential output.

3. A logarithmic intermediate frequency amplifier circuit as claimed in claim 2, wherein one of said primary differential pair of transistors has a base electrode connected to said first input terminal, an emitter electrode connected to said first constant current source, and a collector electrode connected to said second constant current source, another one of said primary differential pair of transistors having a base electrode connected to said second input terminal, an emitter electrode connected to said first constant current source, and a collector electrode connected to said third constant current source;

one of said secondary differential pair of transistors having a base electrode connected to said third input terminal, an emitter electrode connected to said second constant current source, and a collector electrode connected to said first output terminal, another one of said secondary differential pair of transistors having a base electrode connected to said fourth input terminal, an emitter electrode connected to said second constant current source, and a collector electrode connected to said second output terminal;

one of said tertiary differential pair of transistors having a base electrode connected to said fourth input terminal, an emitter electrode connected to said third constant current source, and a collector electrode connected to said first output terminal, another one of said tertiary differential pair of transistors having a base electrode connected to said third input terminal, an emitter electrode connected to said third constant current source, and a collector electrode connected to said second output terminal.

4. A logarithmic intermediate frequency amplifier circuit as claimed in claim 1, wherein said primary differential circuit further comprises:

a plurality of differential pairs of transistors each of which is the same type as that of said primary differential pair of transistors, said plurality of differential pairs of transistors being connected, in parallel, to said primary differential pair of transistors; and at least one of emitter resistor circuits each of which is connected to emitters of at least one of said plurality of differential pairs of transistors for giving a predetermined logarithmic characteristic to one of said first through said M-th double balanced differential circuits.

* * * * *